US012635106B2

(12) United States Patent
Jay et al.

(10) Patent No.: US 12,635,106 B2
(45) Date of Patent: May 19, 2026

(54) APPARATUS FOR AIR MEASUREMENTS

(71) Applicant: The University of Sydney, Sydney (AU)

(72) Inventors: Oliver Jay, Sydney (AU); John Eisenhuth, Sydney (AU); Glenda Anderson, Sydney (AU)

(73) Assignee: The University of Sydney, Sydney (AU)

( * ) Notice: Subject to any disclaimer, the term of this patent is extended or adjusted under 35 U.S.C. 154(b) by 253 days.

(21) Appl. No.: 18/250,605

(22) PCT Filed: Oct. 27, 2021

(86) PCT No.: PCT/AU2021/051248
§ 371 (c)(1),
(2) Date: Apr. 26, 2023

(87) PCT Pub. No.: WO2022/087665
PCT Pub. Date: May 5, 2022

(65) Prior Publication Data
US 2024/0008215 A1 Jan. 4, 2024

(30) Foreign Application Priority Data

Oct. 28, 2020 (AU) ................................ 2020903903

(51) Int. Cl.
H05K 7/20 (2006.01)
G01W 1/02 (2006.01)

(52) U.S. Cl.
CPC .......... H05K 7/20181 (2013.01); G01W 1/02 (2013.01); H05K 7/20145 (2013.01)

(58) Field of Classification Search
CPC ................. G01S 17/931; G01S 7/4813; G01S 2007/4977; G01S 7/027; G01S 17/86;
(Continued)

(56) References Cited

U.S. PATENT DOCUMENTS 6,247,360 B1 * 6/2001 Anderson ............... G01W 1/02
73/170.27
7,753,583 B2 * 7/2010 Loose .................... G01K 13/02
374/138
(Continued)

FOREIGN PATENT DOCUMENTS

CN 102200590 A * 9/2011
CN 102200590 B 3/2013
(Continued)

OTHER PUBLICATIONS

Extended European Search Report for European Patent Application No. 21884154.2, mailed Sep. 16, 2024.
(Continued)

*Primary Examiner* — Mandeep S Buttar
(74) *Attorney, Agent, or Firm* — Lathrop GPM LLP; Wm. Tucker Griffith

(57) ABSTRACT
An apparatus (200) for shielding a sensor, the sensor being configured to measure one or more meteorological parameters, the apparatus (200) including: a first shielding element (202) to be irradiated by sunlight, the first shielding element (202) having a hollow body (204) providing a longitudinal central axis (208), the body (204) at least partly surrounding a chamber (206) in which the sensor is to be located; a second shielding element (212) axially spaced from an upper portion of the body (204) to form an air opening between the first and second shielding elements (202, 212) to permit air to pass from the chamber (206) and across the body (204); the apparatus (200) further including an airflow generator (214) positioned within the chamber (206) and operatively associated with the first and second shielding elements (202, 212) to provide an airflow between the opening and the chamber (206).

5 Claims, 5 Drawing Sheets

(58) Field of Classification Search
CPC . G01S 2013/93273; G01W 1/02; G01W 1/00;
G01W 1/11; G01D 11/245
See application file for complete search history.

(56) References Cited

U.S. PATENT DOCUMENTS

| | | | | |
|---|---|---|---|---|
| 11,815,652 | B2 * | 11/2023 | Van Wyk | G01D 21/02 |
| 2019/0337489 | A1 * | 11/2019 | Baldovino | G01N 21/15 |
| 2020/0064448 | A1 * | 2/2020 | Dubey | G01S 7/4813 |
| 2021/0400179 | A1 * | 12/2021 | Brown | G03B 17/55 |

FOREIGN PATENT DOCUMENTS

| | | | |
|---|---|---|---|
| EP | 3421944 | A1 | 1/2019 |
| JP | 6-562449 | B2 | 8/2019 |
| JP | 2020020712 | A | 2/2020 |
| KR | 102101441 | B | 4/2020 |

OTHER PUBLICATIONS

International Search Report and Written Opinion of PCT International Patent Application No. PCT/AU2021/051248, mailed Dec. 22, 2021.

* cited by examiner

APPARATUS FOR AIR MEASUREMENTS

FIELD

The present invention relates generally to an apparatus for housing one or more sensors and, in particular, to an apparatus for shielding one or more environmental or meteorological sensors.

BACKGROUND

Obtaining accurate meteorological measurements is critical in many fields of application. One such field is heat stress risk forecasting in which humans physiologically react to their thermal environment. Various means have been proposed to ensure meteorological sensors are adequately protected from external factors which may affect the accuracy of such meteorological measurements.

Disadvantageously, such means do not provide sufficient heat resistance, are heavy, cumbersome, and consume vast amounts of power.

OBJECT

It is an object of the present invention to substantially overcome, or at least ameliorate, one or more of the above disadvantages.

SUMMARY OF INVENTION

In one aspect, the invention provides an apparatus for shielding a sensor, the sensor being configured to measure one or more meteorological parameters, the apparatus including:

a first shielding element to be irradiated by sunlight, the first shielding element having a hollow body providing a longitudinal central axis, the body at least partly surrounding a chamber in which the sensor is to be located;

a second shielding element axially spaced from an upper portion of the body to form an air opening between the first and second shielding elements to permit air to pass from the chamber and across the body;

the apparatus further including an airflow generator positioned within the chamber and operatively associated with the first and second shielding elements to provide an airflow between the opening and the chamber.

Preferably, the second shielding element has a domed profile to guide the airflow across an upper surface of the body.

Preferably, the airflow generator is configured to drive airflow from beneath the first shielding element along the axis across a lower surface of the body towards the second shielding element.

In another aspect, the present invention provides an apparatus for shielding a sensor, the sensor being configured to measure one or more meteorological parameters, the apparatus including:

a body to be irradiated by sunlight, the body having a longitudinal central axis, the body including a plurality of elements each extending outwardly with respect to the axis from an inner edge portion to an outer edge portion, with each of the inner edge portions at least partly surrounding a chamber in which the sensor is to be located, and with each of the outer edge portions forming an exterior of the body, wherein the elements are spaced from each other along the axis to form a series of air openings extending between a respective pair of adjacent elements, each of the openings extending from the exterior to the chamber to permit air to pass through the body and into the chamber;

the apparatus further including an airflow generator positioned within the chamber and operatively associated with the body to provide an airflow between the openings and the chamber.

Preferably, each of the elements is in the form of a louvre, the louvres being arranged in a stack along the axis.

Preferably, each of the louvres is centered on the axis and extends radially outwardly with respect to the axis from the inner edge portion to the outer edge portion.

Preferably, each of the louvres includes a surface extending between the inner edge portion and the outer edge portion, with the surface being angled relative to the axis to minimise exposure of the chamber to sunlight.

Preferably, the airflow generator is in the form of a fan.

Preferably, the fan is configured to provide an axial airflow transverse to the axis.

Preferably, the fan has an inlet adjacent a first side of the body, and an outlet adjacent a second side of the body, with the inlet configured to draw air from the first side towards the outlet, and with the outlet configured to move the air through the openings to the second side of the body to cool a portion of the second side.

Preferably, a portion of one or more of the elements is removed adjacent the inlet so that airflow to the inlet is not heated as the airflow flows across the elements and is generally unimpeded by the elements.

BRIEF DESCRIPTION OF DRAWINGS

Exemplary embodiments of the present disclosure will now be described, by way of examples only, with reference to the accompanying description and drawings in which.

DESCRIPTION OF EMBODIMENTS

Referring to FIGS. 1 to 4 of the accompanying drawings, there is depicted an apparatus 100 for shielding one or more sensors (not shown). Each sensor is configured to measure an environmental or meteorological parameter or variable such as air temperature, relative humidity or air pollution. For example, the sensors may include a dry bulb thermometer and a wet bulb thermometer. The described embodiment is equally applicable to shielding other types of sensors for measuring other types of parameters. In one embodiment, the sensor disposed in the apparatus 100 is exchangeable with another sensor, enabling different sensors to be used depending on the environmental or meteorological parameter to be measured. The apparatus 100 is intended to be part of a thermal environment measurement unit (tEMU) for assessing thermal occupational environments, such as sporting events or the mining industry.

Figure 3:
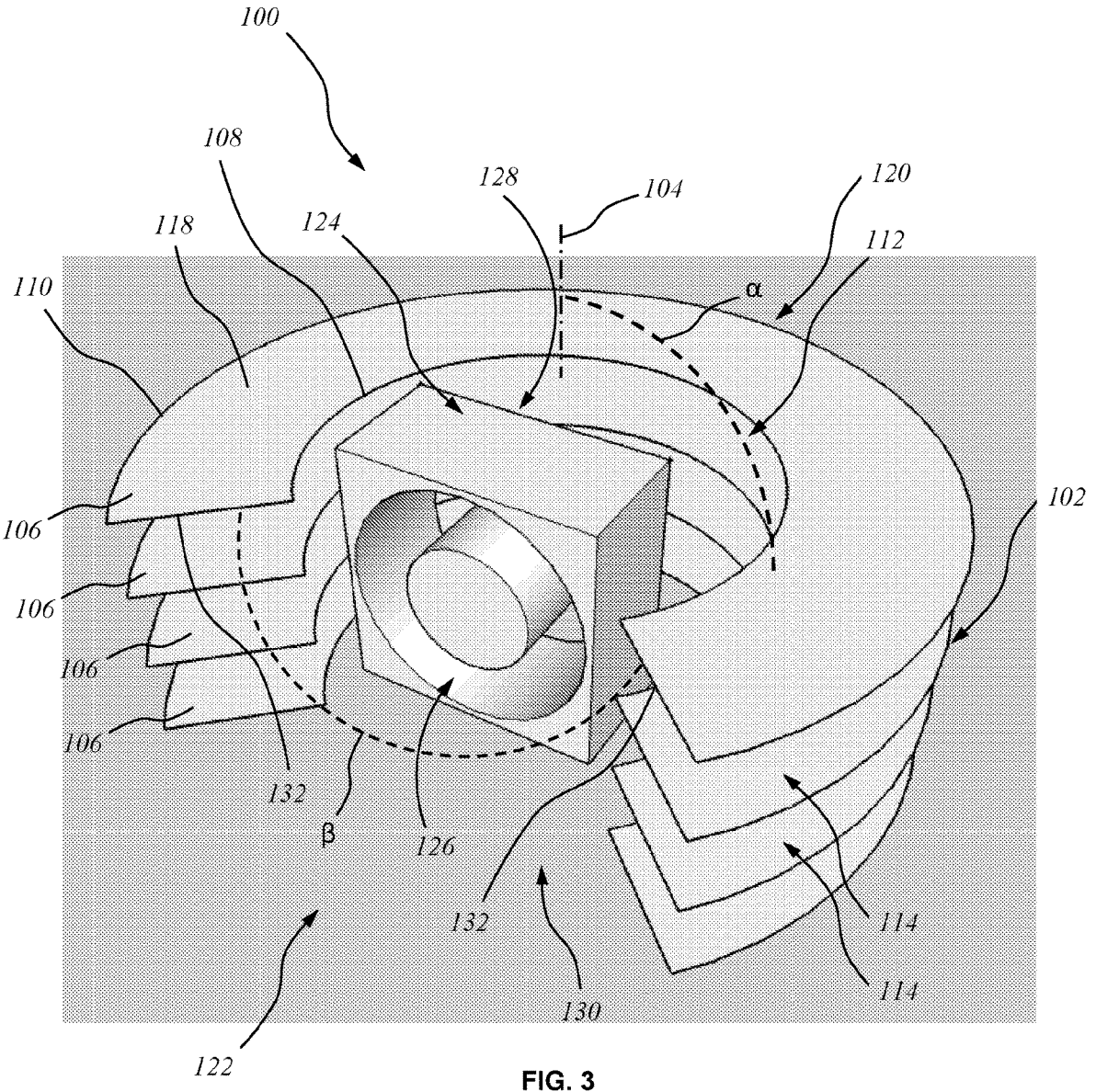
FIG. 3 is a simplified, schematic, rear perspective view of the apparatus of FIG. 1, shown with a top portion of the apparatus removed.
Figure 4:
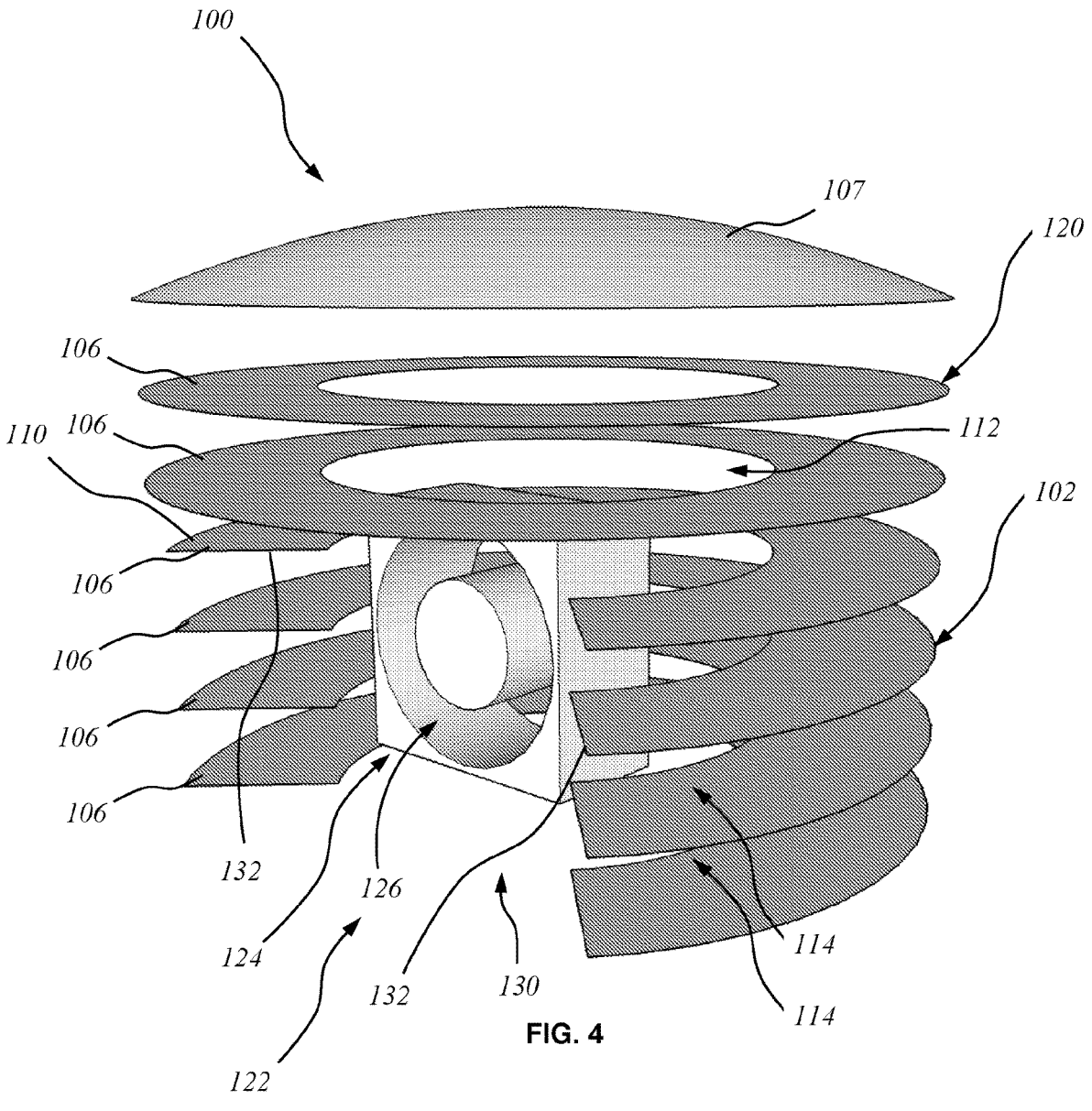
FIG. 4 is an additional simplified, schematic, rear perspective view of the apparatus of FIG. 1, shown with the top portion.

The apparatus 100 includes a body 102 configured to be irradiated by sunlight. The body 102 has a longitudinal central axis 104. The body 102 is intended to be positioned relative to a support surface 105 so that the axis 104 is generally vertical. The body 102 is formed by a plurality of shielding elements in the form of louvres 106 which are arranged in a vertical stack along the axis 104. With particular reference to FIG. 3, each of the louvres 106 is generally centered on the axis 104 so as to extend radially outwardly with respect to the axis 104 from an inner edge portion 108 to an outer edge portion 110. Each of the inner edge portions 108 surrounds an internal chamber 112 of the body 102 in which the sensor(s) is to be located. Each of the outer edge portions 110 forms part of the exterior of the body 102. In other embodiments, each of the louvres 106 may not necessarily be circular in configuration but may instead form an ellipse, square, rectangular or other polygonal profile.

Each of the louvres 106 in the stack are spaced from each other along the axis 104 to form a series of air openings 114 extending between a respective pair of adjacent louvres 106. Each of the openings 114 extends from the exterior of the body 102 to the chamber 112 to permit air to flow generally laterally through the body 102 and into the chamber 112. Each of the louvres 106 in the stack includes a plurality of axially extending stand-offs or projections 116 (see FIG. 2) adjacent the inner edge portion 108. The projections 116 of one of the louvres 106 engage the corresponding projections 116 of the adjacent louvre 106 so as to maintain the axial spacing between the louvres 106.

The apparatus 100 further includes a ceiling element 107 (FIG. 2) centered on the axis 104 and spaced from the uppermost louvre 106 of the body 102 by way of ceiling stand-offs 117. The ceiling element 107 extends radially outwardly with respect to the axis 104 and is tapered to form a generally frustoconical profile. In this way, the ceiling element 107 vertically shrouds the chamber 112 and the body 102.

With reference to FIG. 3, each of the louvres 106 includes a surface 118 extending between the inner edge portion 108 and the outer edge portion 110. Each of the surfaces 118 is angled relative to the axis 104 so as to laterally minimise exposure of the chamber 112 to sunlight whilst permitting air to flow laterally between the surface 118 and the chamber 112 thereby permitting ambient air to circulate freely through the chamber 112 without collecting and warming inside the chamber 112. In a preferred embodiment, each of the surfaces 118 forms an obtuse angle α with the axis 104 in the range of about 110 degrees to 120 degrees, more preferably 116 degrees. The angle α of each louvre 106 is selected to at least minimise exposure of the inner edge portions 108 to direct sunlight. The angle α of each louvre 106 is also selected to at least minimise pockets of warm air from forming within the chamber 112, particularly adjacent the sensors.

The portion of the louvres 106 which are directly exposed to sunlight define a leading side 120 of the body 102, whilst the portion of the louvres 106 which are indirectly exposed to sunlight define a trailing side 122 of the body 102. A width of each of the louvres 106 is optimised to enlarge the chamber 112 and reduce thermal mass whilst minimising sunlight from entering the chamber 112.

Figure 1:
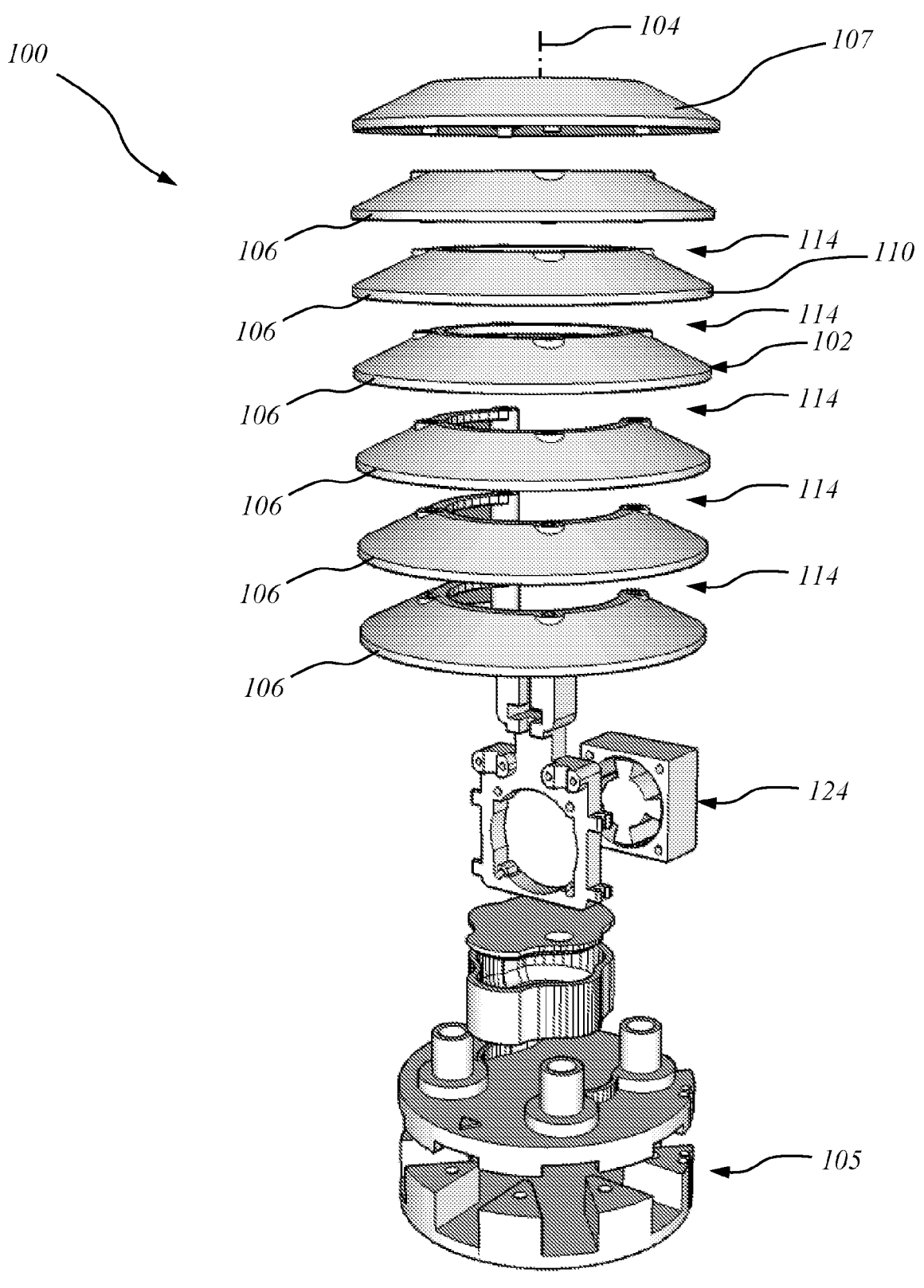
FIG. 1 is a front elevation of an apparatus according to an embodiment of the present disclosure.
Figure 2:
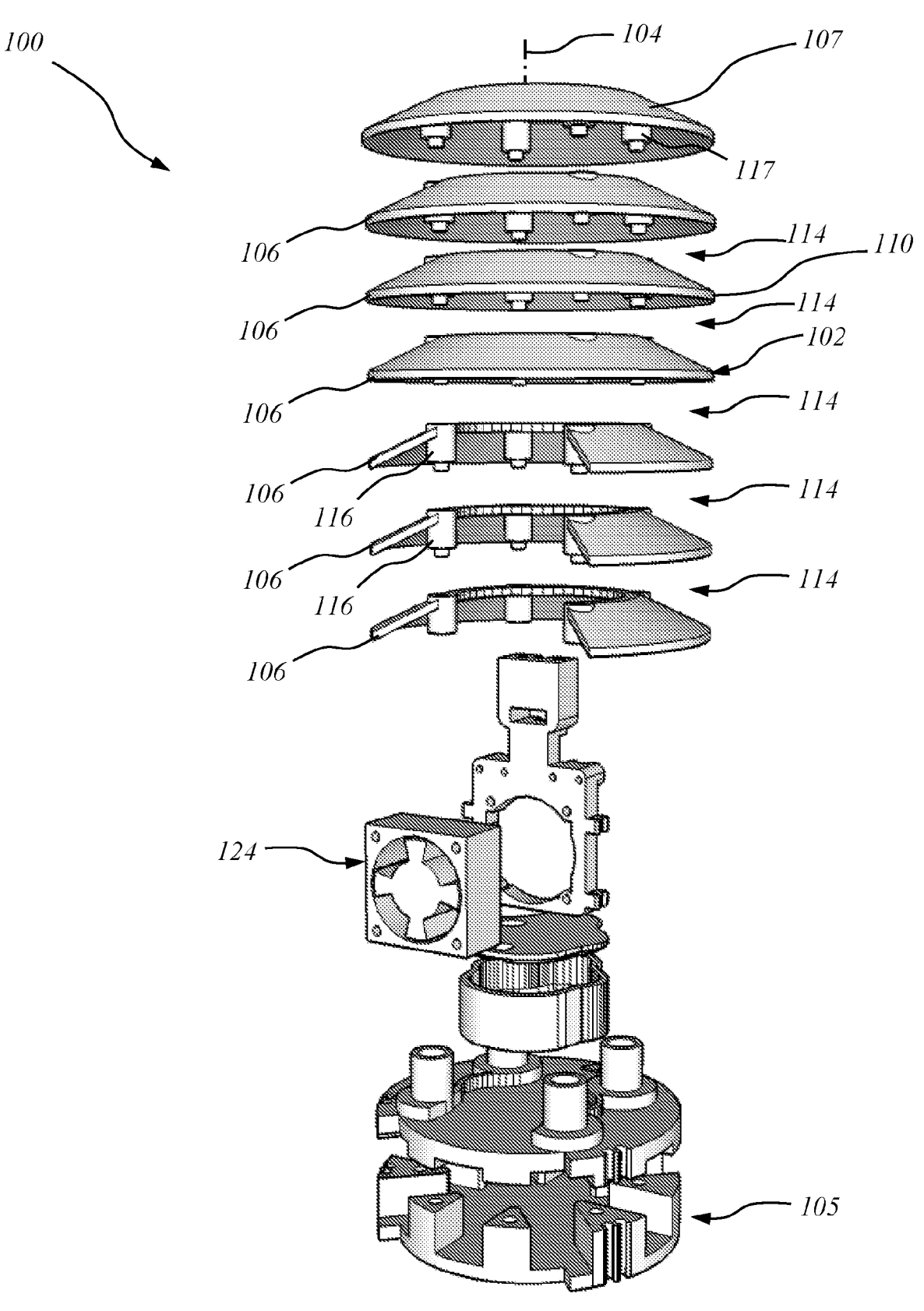
FIG. 2 is a rear elevation of the apparatus of FIG. 1.

The apparatus 100 further includes an airflow generator in the form of an axial-flow fan 124 (See FIGS. 2 and 3). The fan 124 is positioned within the chamber 112 adjacent the inner edge portions 108 of each of the louvres 106. The fan 124 has an inlet 126 adjacent the trailing side 122 of the body 102 and an outlet 128 adjacent the leading side 120 of the body 102. The fan 124 is configured to provide an axial airflow transverse to the axis 104 so as to draw ambient air from the trailing side 122 of the body 102 towards the inlet 126 and into the chamber 112 and subsequently push the air forwards from the outlet 128 through the air openings 114 to the leading side 120 of the body 102. In this way, the fan 124 drives airflow across the surfaces 118 of the louvres 106 which are more exposed to the sunlight to cool the surfaces 118 and minimise excessive heating of the surfaces 118, particularly when exposed to sunlight for an extended period.

In a preferred embodiment, the fan 124 operates at a rotational speed in the range of about 6500 rpm to 7500 rpm, more preferably 7200 rpm, to provide an axial airflow speed in excess of 3 m/s as measured at the extremities of the fan blades. In other embodiments, the fan 124 may operate to provide an axial airflow speed of less than 3 m/s. The speed is optimised to ensure accurate sensor measurements for precise measure of the environmental parameter whilst minimising power consumption of the fan 124. Each sensor is mounted at a defined distance and position to the fan 124 to ensure the required air speed.

In the embodiment depicted, a cut-out 130 is formed on the trailing side 122 of the body 102 through several of the louvres 106 adjacent the inlet 126 of the fan 124. The cut-out 130 serves to remove a portion of each of the louvres 106 adjacent the inlet 126 to facilitate drawing of air towards the inlet 126 as well as to minimise heating of the ambient air drawn towards the inlet 126 as it flows across the louvres 106 which may be exposed to sunlight. The cut-out 130 is formed through each of the affected louvres 106 so as to define a pair of intermediate edge portions 132 each extending generally transversely between the inner and outer edge portions 108, 110 of the respective affected louvre 106. An angle β measured between the intermediate edge portions 132 is preferably in the range of about 90 to 100 degrees, more preferably 94 degrees. In other embodiments, the angle β may be less than 90 degrees or greater than 100 degrees. The cut-out 130 is optimised to ensure the entire inlet 126 of the fan 124 is unimpeded by the louvres 106 whilst ensuring the affected louvres 106 extend sufficiently partly circumferentially to at least minimise sunlight from entering the chamber 112 when the sun is at low angles in the sky or the chamber 112 is slightly misaligned. Increasing the angle β above 100 degrees may be desired for various reasons, for example, during a particular season (such as during winter rather summer) or in locations at lower/higher latitudes. In other embodiments, the cut-out 130 may be eliminated altogether.

In the embodiment depicted, the leading side 120 of the apparatus 100 is configured to face north in the southern hemisphere and south in the northern hemisphere to ensure the sensors are adequately shielded from solar radiation by the louvres 106 without having to move the apparatus 100 for the entire day and at any time of the year. In some embodiments, the apparatus 100 may include an integrated compass (not shown) or other means to indicate north.

In one embodiment, the louvres 106 are elliptical with the major axis in the direction perpendicular to the direction toward which the leading side 120 is facing. Accordingly, the minor axis of the ellipse is in the direction parallel to the direction toward which the leading side 120 is facing.

In one or more embodiments, the apparatus 100 includes structures (not shown) to divert the airflow across the surfaces 118 to further assist cooling of the leading side 120 of the louvres 106.

In one or more embodiments, the apparatus 100 includes a water container (not shown) located within the chamber 112 for wetting one or more of the sensors.

By virtue of the arrangement of the fan 124 within the chamber 112, ambient air is permitted to be drawn into the chamber 112 and used to cool the surfaces 118 of the exposed leading side 120 to minimise exposure of the chamber 112 to adjacent warmer surfaces. Utilising the air movement across the surfaces 118 of the exposed leading side 120 to keep the surfaces 118 cool allows the apparatus 100 to compensate for a reduction in space between the inner edge portions 108 and the sensors located within the chamber 112 to reduce the overall size and increase portability of the apparatus 100.

Figure 5:
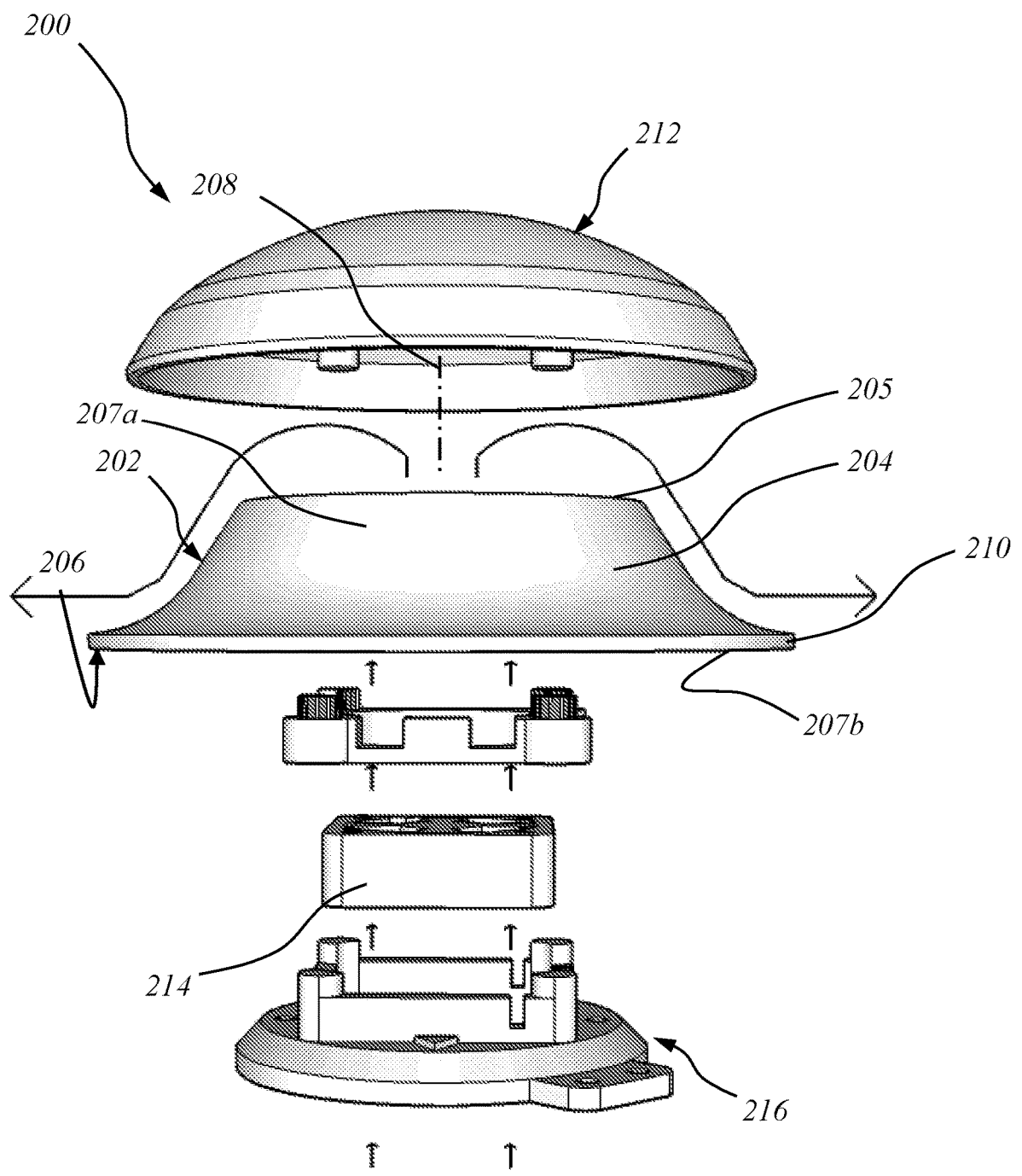
FIG. 5 is a parts exploded view of an apparatus according to a second embodiment.

Referring to FIG. 5, there is depicted an apparatus 200 according to a second embodiment for shielding the one or more sensors.

The apparatus 200 includes a first shielding element 202 configured to be irradiated by sunlight. The shielding element 202 has a generally hollow frustoconical body 204 surrounding an interior chamber 206 within which the sensor(s) is to be located. The body 204 provides a longitudinal central axis 208. The body 204 is intended to be positioned relative to a support surface so that the axis 208 is generally vertical.

The body 204 has an upper rim 205 surrounding an open top to the interior chamber 206. A lower portion of the body 204 flares to form a skirt 210. Extending between the upper rim 205 and the skirt 210 are opposing top and bottom surfaces 207*a*, 207*b*.

The apparatus 200 further includes a second shielding element to be irradiated by sunlight. The second shielding element is in the form of a ceiling 212 centered on the axis 208 and axially spaced from an upper portion of the body 204 to form an air opening between the ceiling 212 and the shielding element 202. The ceiling 212 is in the form of a dome having a maximum diameter less than a diameter of the skirt 210 but greater than a diameter of the upper rim 205. In this way, the ceiling 212 is configured to vertically shield the chamber 206 and the body 204 from radiation.

The apparatus 200 further includes an airflow generator in the form of an axial-flow fan 214. Operational parameters of the fan 214 are generally the same as the fan 124.

In contrast to the fan 124 of the first embodiment, the fan 214 of the second embodiment is positioned within the chamber 206 so as to draw ambient air in a vertical direction along the axis 208 from beneath the body 204 towards the ceiling 212. By virtue of the domed profile of the ceiling 212, the ambient air is guided towards the air opening so that the air flows over the top surface 207*a* of the body 204 in a direction away from the chamber 206. In this way, the ambient air is driven to flow uniformly along the bottom surface 207*b* of the shielding element 202 thereby continuously removing heat from the surface 207*b* and expelling the air away from the fan 214 to minimise potentially warmer air from being drawn back into the chamber 206 by the fan 214. In the embodiment depicted, the fan 214 is secured within the chamber 206 via a fan mount 216. Optionally, an additional shielding element (not shown) may be arranged on top of the ceiling element 212 which would not necessarily be cooled by the air flow but would act as a physical barrier to reduce direct radiation on the ceiling element 212 and the lower shielding element 202.

Compared to the apparatus 100 of the first embodiment, the apparatus 200 of the second embodiment provides the following advantages:

The apparatus 200 has a smaller footprint and better scalability within limits;

The apparatus 200 has fewer parts translating to simpler and cheaper manufacturing processes;

The apparatus 200 is not constrained to be positioned in a particular cardinal direction;

The apparatus 200 may be easier to weather proof;

The apparatus 200 is configured for use with a capacitance based humidity sensor to measure humidity directly and thereby:

i) Eliminates the need for a large reservoir of water necessary for wet bulb temperature and calculation of humidity; and ii) Eliminates the need to constantly top-up the reservoir allowing the system to operate for extended periods unattended.

NUMERAL REFERENCE LIST

100 Apparatus according to a first embodiment
102 Body
104 Central axis
105 Support surface
106 Louvres
107 Ceiling element
108 Inner edge portion
110 Outer edge portion
112 Chamber
114 Air openings
116 Projections
117 Ceiling stand-offs
118 Surface
120 Leading side
122 Trailing side
124 Fan
126 Inlet
128 Outlet
130 Cut-out
132 Intermediate edge portions
200 Apparatus according to a second embodiment
202 Shielding element
204 Body
205 Upper rim
206 Chamber
207*a,b* Top and bottom surfaces
208 Central axis
210 Skirt
212 Ceiling
214 Fan
216 Fan mount

The invention claimed is:

1. An apparatus for shielding a sensor, the sensor being configured to measure one or more meteorological parameters, the apparatus including:

a body to be irradiated by sunlight, the body having a longitudinal central axis, the body including a plurality of elements each extending outwardly with respect to the axis from an inner edge portion to an outer edge portion, with each of the inner edge portions at least partly surrounding a chamber in which the sensor is to be located, and with each of the outer edge portions forming an exterior of the body, wherein the elements are spaced from each other along the axis to form a series of air openings extending between a respective pair of adjacent elements, each of the openings extending from the exterior to the chamber to permit air to pass through the body and into the chamber;

the apparatus further including a fan positioned within the chamber and operatively associated with the body to provide an axial airflow transverse to the central axis between the openings and the chamber, wherein the fan has an inlet adjacent a first side of the body, and an outlet adjacent a second side of the body, with the inlet configured to draw air from the first side towards the outlet, and with the outlet configured to move the air through the openings to the second side of the body to cool a portion of the second side.

2. The apparatus of claim 1, wherein each of the elements is in the form of a louvre, the louvres being arranged in a stack along the axis.

3. The apparatus of claim 2, wherein each of the louvres is centered on the axis and extends radially outwardly with respect to the axis from the inner edge portion to the outer edge portion.

4. The apparatus of claim 3, wherein each of the louvres includes a surface extending between the inner edge portion and the outer edge portion, with the surface being angled relative to the axis to minimise exposure of the chamber to sunlight.

5. The apparatus of claim 1, wherein a portion of one or more of the elements is removed adjacent the inlet so that airflow to the inlet is not heated as the airflow flows across the elements and is generally unimpeded by the elements.

* * * * *